(12) United States Patent
Tsai et al.

(10) Patent No.: US 9,859,356 B2
(45) Date of Patent: Jan. 2, 2018

(54) SEMICONDUCTOR INTEGRATED CIRCUIT

(71) Applicant: MEDIATEK INC., Hsin-Chu (TW)

(72) Inventors: Ming-Da Tsai, Miaoli County (TW);
Tao-Yi Lee, Taichung (TW);
Cheng-Chou Hung, Hsinchu (TW);
Tung-Hsing Lee, New Taipei (TW)

(73) Assignee: MediaTek, Inc., Hsin-Chu (TW)

( * ) Notice: Subject to any disclaimer, the term of this patent is extended or adjusted under 35 U.S.C. 154(b) by 0 days.

(21) Appl. No.: 15/044,121

(22) Filed: Feb. 16, 2016

(65) Prior Publication Data
US 2016/0351653 A1    Dec. 1, 2016

Related U.S. Application Data

(60) Provisional application No. 62/166,705, filed on May 27, 2015.

(51) Int. Cl.
*H01L 29/00* (2006.01)
*H01L 49/02* (2006.01)
*H01L 23/522* (2006.01)

(52) U.S. Cl.
CPC .......... *H01L 28/10* (2013.01); *H01L 23/5227* (2013.01)

(58) Field of Classification Search
CPC .................. H01L 28/10; H01L 23/5386
USPC ........................................... 257/531
See application file for complete search history.

(56) References Cited

U.S. PATENT DOCUMENTS

| 7,262,481 | B1 | 8/2007 | Marques | |
| 7,999,386 | B2* | 8/2011 | Uchida | H01L 23/5227 257/759 |
| 8,866,579 | B2* | 10/2014 | Hachiya | H01F 27/255 336/200 |
| 2009/0140383 | A1* | 6/2009 | Chang | H01F 17/0013 257/531 |
| 2014/0252542 | A1 | 9/2014 | Lee | |
| 2014/0284762 | A1 | 9/2014 | Yeh | |

* cited by examiner

*Primary Examiner* — Theresa T Doan
(74) *Attorney, Agent, or Firm* — Optimus Patent US, LLC

(57) ABSTRACT

A semiconductor integrated circuit includes an inductor and a plurality of high permeability patterns. The inductor includes one conductive loop. The high permeability patterns are disposed adjacent to the conductive loop.

18 Claims, 8 Drawing Sheets

SEMICONDUCTOR INTEGRATED CIRCUIT

CROSS REFERENCE TO RELATED APPLICATIONS

This application claims the benefit of U.S. provisional application No. 62/166,705, filed May 27, 2015, and the entirety of which is incorporated by reference herein.

BACKGROUND

The present invention relates generally to a semiconductor integrated circuit. More particularly, the present invention relates to a semiconductor integrated circuit with high permeability patterns.

Many electrical products have semiconductor integrated circuits (IC) for providing electricity control function, wherein integrated inductors in the semiconductor IC are commonly used in radio frequency (RF) or high-speed circuit design for tuning capacitive loading. Quality factor of integrated inductors is the ratio of the inductance value to the resistivity value of the integrated inductor, which is one of the most important keys that dominates noise figure of receiver or efficiency of transmitter and power amplifier. Therefore, to improve quality factor of integrated inductors is an important issue for manufacturers.

SUMMARY

It is therefore one of the objects of the present invention to provide an semiconductor integrated circuit with improved quality factor by the way of disposing high permeability patterns in the semiconductor integrated circuit.

The present invention provides a semiconductor integrated circuit that includes an inductor and a plurality of high permeability patterns. The inductor includes one conductive loop. The high permeability patterns are disposed adjacent to the conductive loop.

The high permeability patterns changes the distribution and intensity of the magnetic field near the conductive loop such that the alternating current (AC) resistivity value is lowered and the inductance value is raised. Therefore, the quality factor is improved and the performance of the inductor in the semiconductor integrated circuit of the present invention is improved accordingly.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the present invention to the skilled users in the technology of the present invention, preferred embodiments will be detailed as follows. The embodiments of the present invention are illustrated in the accompanying drawings with numbered elements to elaborate on the contents and effects to be achieved.

Figure 1:
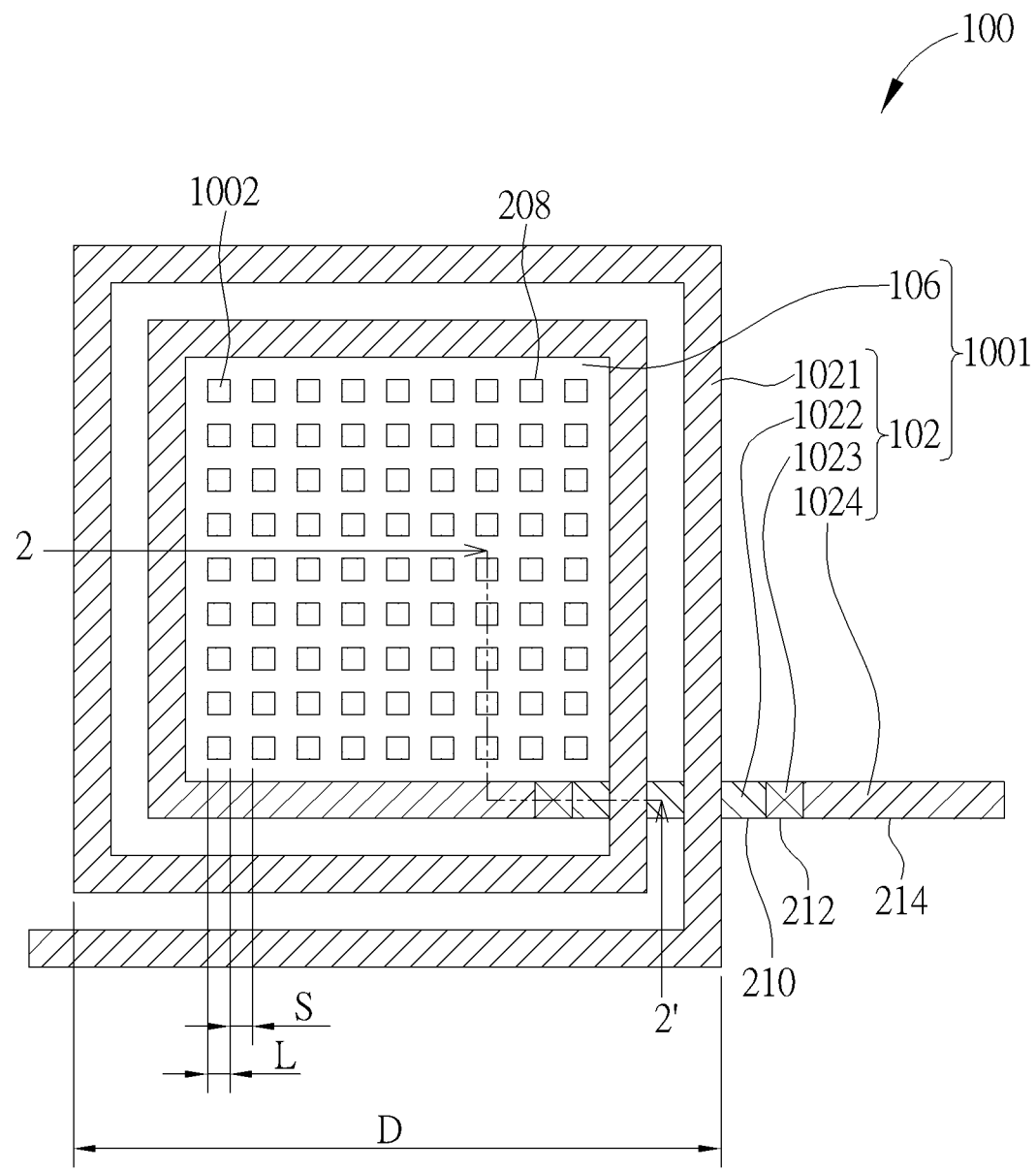
FIG. 1 is a top view of a semiconductor integrated circuit according to a first embodiment of the present invention
Figure 2:
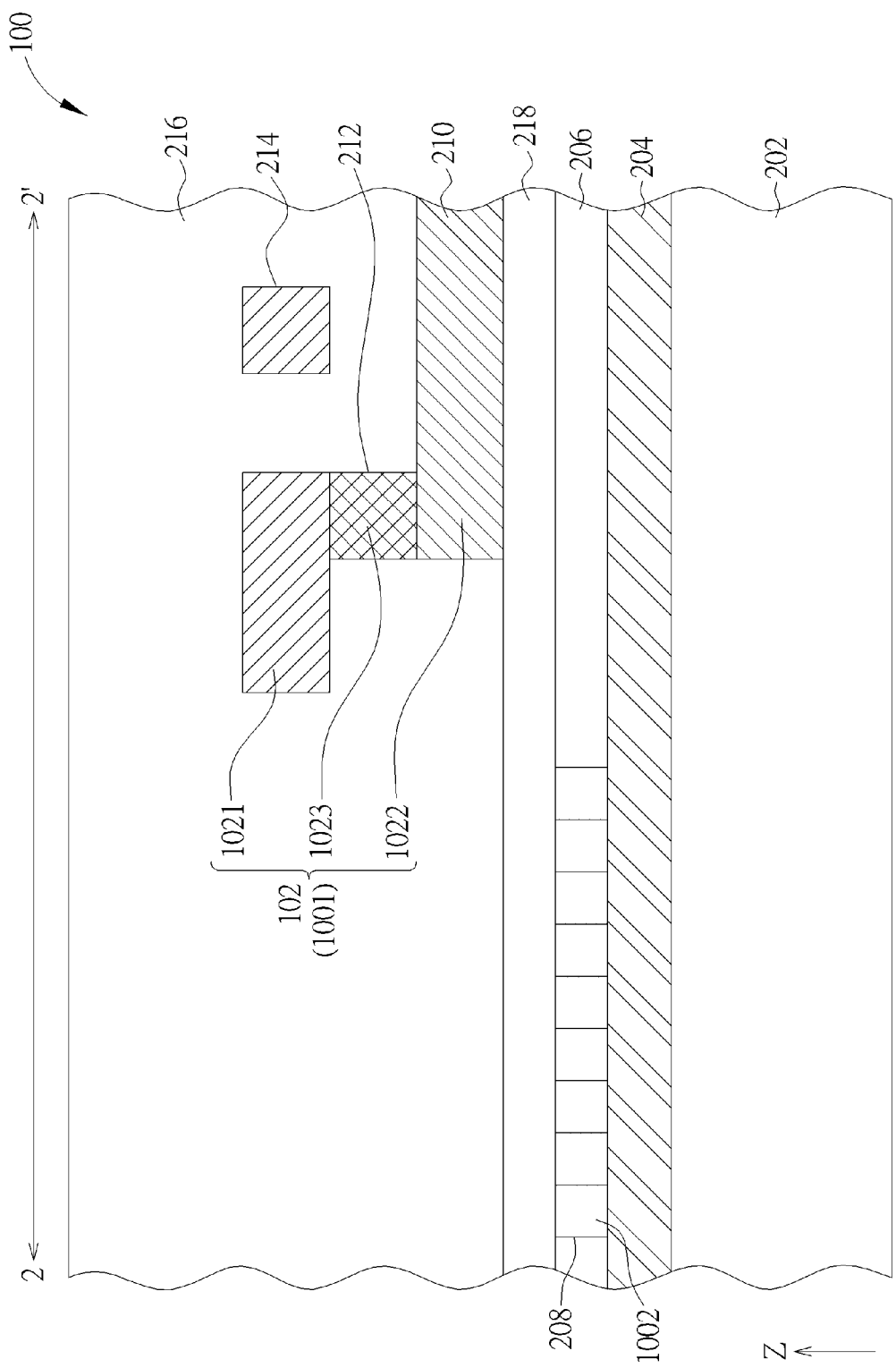
FIG. 2 is a partial sectional view of the semiconductor integrated circuit shown in FIG. 1.

Referring to FIG. 1 and FIG. 2, FIG. 1 is a top view of a semiconductor integrated circuit according to a first embodiment of the present invention, and FIG. 2 is a partial sectional view of the semiconductor integrated circuit according to the cross line 2-2' shown in FIG. 1. The semiconductor integrated circuit 100 of the present invention may be, but not limited to, an integrated passive device and is formed on a substrate 202 having a base insulating layer 204 thereon. The substrate 202 is a semiconductor substrate, such as a silicon substrate, but not limited thereto. For example, the substrate may be a silicon containing substrate (such as a silicon carbide substrate), an III-V group-on-silicon (such as GaN-on-silicon) substrate, a graphene-on-silicon substrate, a silicon-on-insulator (SOI) substrate or an epitaxial layer containing substrate in various embodiments. The base insulating layer 204 may be an oxide layer and have a thickness of 5 micrometers for example. The semiconductor integrated circuit 100 includes an inductor 1001 and a plurality of high permeability patterns 1002. The inductor 1001 includes one conductive loop 102 formed on the substrate 202. The inductor 1001 of this embodiment is a planar spiral inductor, and therefore the conductive loop 102 is planar spiral. However, many different types of conductive loop, such as solenoid inductor or stacked spiral inductor, may be applied to the present invention, not limited to planar spiral type. The conductive loop 102 is composed of at least one conductive layer. The conductive layer may include any conductive material, such as metal and metal oxide. In this embodiment, the conductive loop 102 is composed of three conductive layers which are the first conductive layer 210, the second conductive layer 212, and the third conductive layer 214 from bottom to top. The three conductive layers may be made of the same material or different materials. In this embodiment, all of the three conductive layers are composed of copper, but not limited thereto. The third conductive layer 214 forms a coil portion 1021 and a connection portion 1024 of the conductive loop 102. The coil portion 1021 serves as a coil of the inductor 1001 and has a planar spiral shape in this embodiment. The connection portion 1024 may be used for electrically connecting the inductor 1001 to an external device, such as a circuit or a bonding pad. The first conductive layer 210 includes a bridge portion 1022 for electrically connecting the coil portion 1021 and the connection portion 1024. The second conductive layer 212 forms contact plugs 1023 disposed between the overlap portions of the bridge portion 1022 and the coil portion 1021/connection portion 1024. In this embodiment, the bridge portion 1022 is positioned below the coil portion 1021 and the connection portion 1024, but the bridge portion 1022 may be positioned above both the coil portion 1021 and the connection portion 1024 in other embodiments. In that case, the bridge portion 1022 and the coil portion 1021/connection portion 1024 are composed of the third conductive layer 214 and the first conductive layer 210 respectively. In this embodiment, the first conductive layer 210, the second conductive layer 212, and the third conductive layer 214 respectively have a thickness ranged from about 2 to 3 micrometers, but not limited thereto. In addition, in some embodiments, the contact plugs 1023 and the upper element part of the inductor 1001, such as the coil portion 1021, are composed with the same conductive layer, which means the contact plugs 1023 and the coil portion 1021 are formed at the same time. For example, when forming the material layer of the coil portion 1021, the plug hole is also filled by the same material layer to form the contact plugs 1023 simultaneously. In addition, the first, second and third conductive layers 210, 212, 214 of the inductor 1001 are formed in an interlayer dielectric (ILD) layer 216, wherein the ILD layer 216 may be composed of oxide material for instance. The fabrication process of the inductor 1001 may be a post passive inductor (PPI) process, but not limited thereto.

The inductor 1001 further includes a dielectric region 106 adjacent to the conductive loop 102, which is enclosed by the coil portion 1021. The high permeability patterns 1002 of the present invention are at least disposed adjacent to the conductive loop 102. In this embodiment, the high permeability patterns 1002 are disposed within the dielectric region 106 and enclosed by the coil portion 1021. The high permeability patterns 1002 are composed of a high permeability layer 208 disposed on the substrate 202. Each of the high permeability patterns is electrically isolated from each other. And each of the high permeability patterns is electrically isolated from the conductive layers that forms the inductor 1001, the first conductive layer 210, the second conductive layer 212, and the third conductive layer 214, and is electrically floating with respect to circuit ground in this embodiment. However, it is noteworthy that in a variant embodiment that the high permeability patterns 1002 are pattern ground shielded (PGS) and electrically connected to circuit ground such that there is seldom eddy current loss. In addition, the high permeability layer 208 is disposed between the conductive layer composing the inductor 1001 and the substrate 202 in this embodiment. The high permeability layer 208 includes material(s) with high permeability. For example, the high permeability layer 208 may be composed of iron, cobalt, nickel, an alloy of the above-mentioned materials, or a combination of the above-mentioned materials and alloys, but not limited thereto. Any material have high permeability may be applied to the high permeability layer 208 of the present invention. In this embodiment, the high permeability patterns 1002 are made of nickel, whose permeability is $1.26*10^{-4}$ to $7.54*10^{-4}$. As an example, the thickness of the high permeability patterns 1002 is, but not limited to, about 0.1 to about 10 micrometers. In a variant embodiment, the thickness of the high permeability patterns 1002 may be 2 micrometers. In another variant embodiment, the thickness of the high permeability patterns 1002 may be 5 micrometers. In addition, the high permeability patterns 1002 preferably have geometric shapes, such as square and cross. In FIG. 1, the high permeability patterns 1002 have square shapes for instance.

Furthermore, the high permeability patterns 1002 are arranged as an array, which means the high permeability patterns 1002 are arranged side by side in several lines. The size of the high permeability patterns 1002 may be represented by the length L and the spacing S represents the distance between adjacent two high permeability patterns 1002. In this embodiment, the size of the high permeability patterns 1002, the length L, is equal to the spacing S, but not limited thereto. In various embodiments, the size of the high permeability patterns 1002 may be different from the spacing S. The size of the high permeability patterns 1002 may be about 3 micrometers to about 10 micrometers and the diameter D of the inductor 1001 (also the diameter of the coil portion 1021) is about 500 micrometers as an example in this embodiment. Accordingly, the diameter D of the inductor 1001 is equal to or more than fifty times of the size of the high permeability patterns 1002. More preferably, the diameter D of the inductor 1001 is equal to or more than hundredfold of the size of the high permeability patterns 1002. Furthermore, the high permeability patterns 1002 are disposed in a dielectric layer 206 formed on the base insulating layer 204. For example, the dielectric layer 206 may have the same material as the ILD layer 216, but not limited thereto. In addition, a dielectric layer 218 may be further disposed between the dielectric layer 206 and the first conductive layer 210.

By disposing the high permeability patterns 1002 in the dielectric region 106 of the inductor 1001, the magnetic field of the dielectric region 106 is increased and the whole magnetic field distribution of the inductor 1001 is more even so as to uniform the current of the whole conductive loop 102. Therefore, the magnetic energy storage and the inductance value of the inductor 1001 are increased and the AC resistivity value is decreased such that the quality factor of the inductor 1001 is effectively raised. Based on this embodiment, a traditional inductor without high permeability patterns may have a quality factor of 11.389, while the quality factor of the present invention having accompanied high permeability patterns 1002 with the size of 3 micrometers and 10 micrometers are respectively 19.301 and 16.168. Accordingly, in the embodiment that the size of the high permeability patterns 1002 is 3 micrometers, the quality factor of the present invention inductor 1001 is about 1.70 times of the traditional inductor. It is noteworthy that the high permeability patterns 1002 with smaller size are more effective in improving the quality factor than the high permeability patterns 1002 with larger size.

The semiconductor integrated circuit of the present invention is not limited by the aforementioned embodiment, and may have other different preferred embodiments and variant embodiments. To simplify the description, the identical components in each of the following embodiments and variant embodiments are marked with identical symbols. For making it easier to compare the difference between the embodiments and variant embodiments, the following description will detail the dissimilarities among different embodiments and variant embodiments and the identical features will not be redundantly described.

Figure 3:
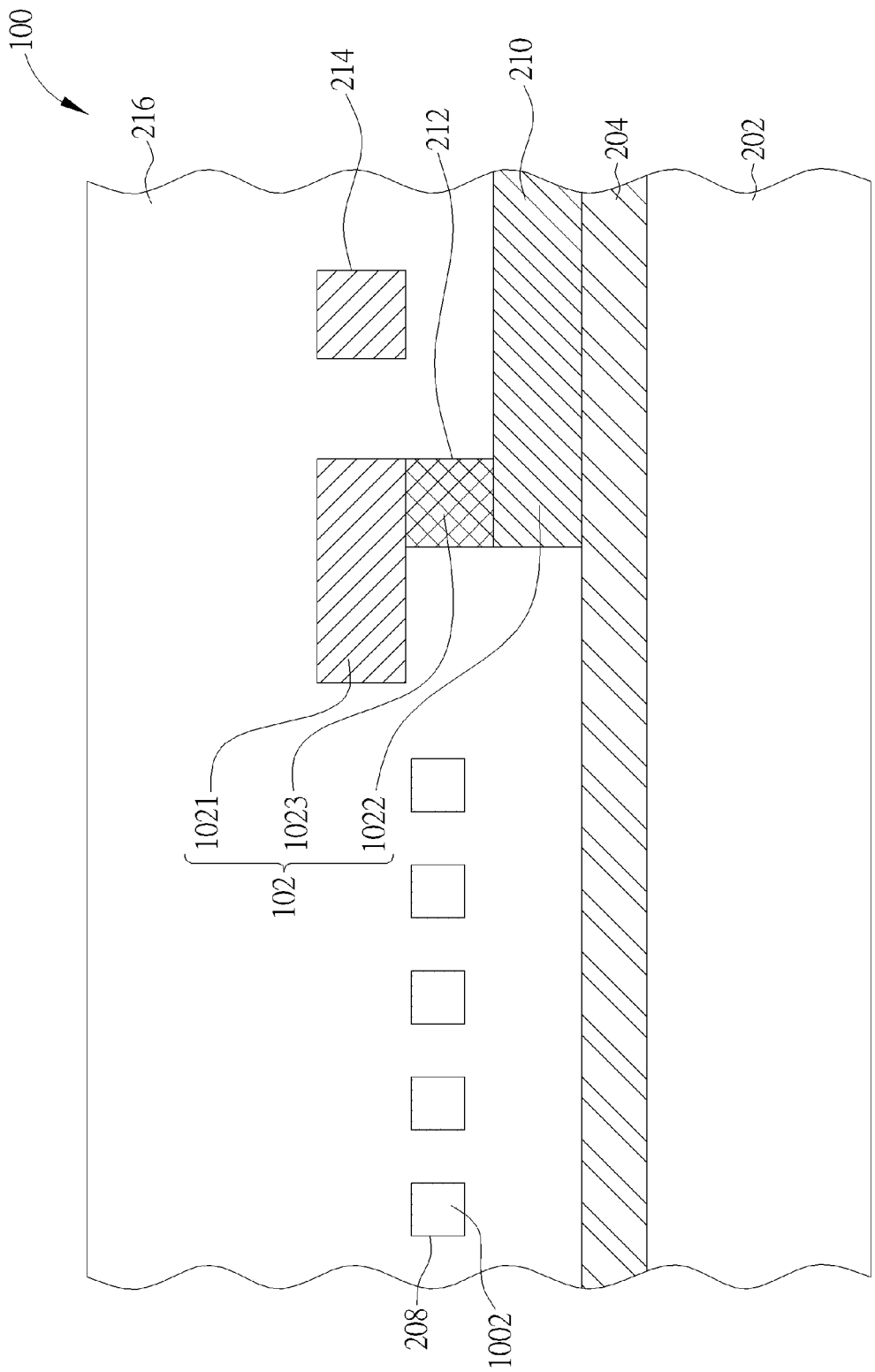
FIG. 3 is a partial sectional view of the semiconductor integrated circuit according to a first variant embodiment of the first embodiment of the present invention.

Referring to FIG. 3, FIG. 3 is a partial sectional view of the semiconductor integrated circuit according to a first variant embodiment of the first embodiment of the present invention. The difference between this variant embodiment and the first embodiment is that the high permeability layer 208 is disposed between the first conductive layer 210 and the third conductive layer 212, and also disposed between the substrate 202 and the third conductive layer 212. In the fabrication process, the high permeability layer 208 may be formed after the second conductive layer 1023 but before the third conductive layer 1021. However, in another variant embodiment, the high permeability layer 208 may be formed before the second conductive layer 1023.

Figure 4:
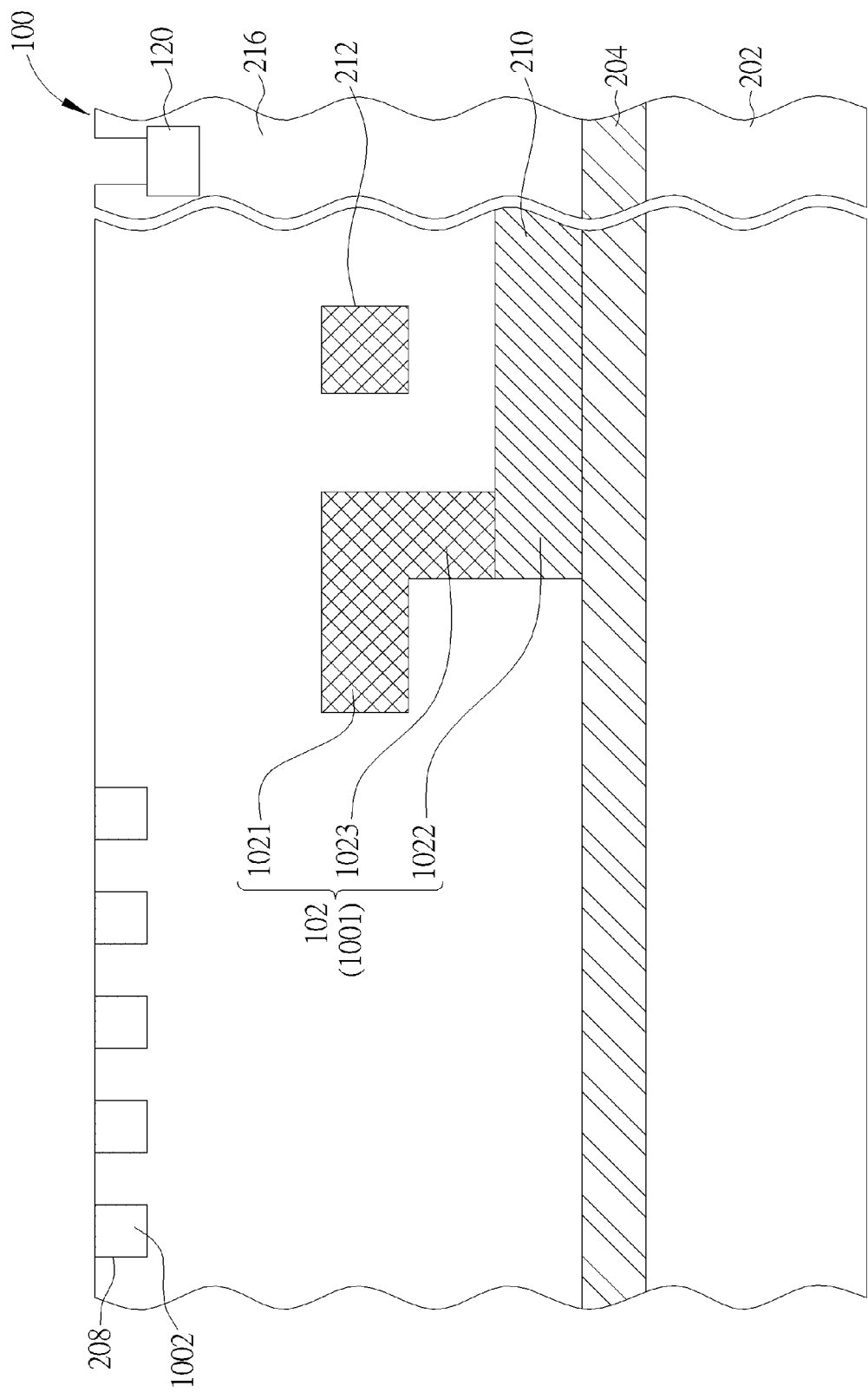
FIG. 4 is a partial sectional view of the semiconductor integrated circuit according to a second variant embodiment of the first embodiment of the present invention.

Referring to FIG. 4, FIG. 4 is a partial sectional view of the semiconductor integrated circuit according to a second variant embodiment of the first embodiment of the present invention. The difference between this variant embodiment and the first embodiment is that the high permeability layer 208 is disposed above the inductor 1001. Furthermore, the bridge portion 1022 and the coil portion 1021 are formed with the same second conductive layer 212. Therefore, both the conductive layers composing the inductor 1001 (the first conductive layer 210 and the second conductive layer 212) are disposed between the high permeability layer 208 and the substrate 202. In the fabrication process of this variant embodiment, the high permeability layer 208 is formed after the formation of the inductor 1001. In this variant embodiment, the semiconductor integrated circuit 100 of the present invention further includes an connection pad 120 (such as an aluminum pad) disposed on the substrate 202 above the inductor 1001, wherein the connection pad 120 is used for connecting the semiconductor integrated circuit 100 to an external device, but not limited thereto.

Figure 5:
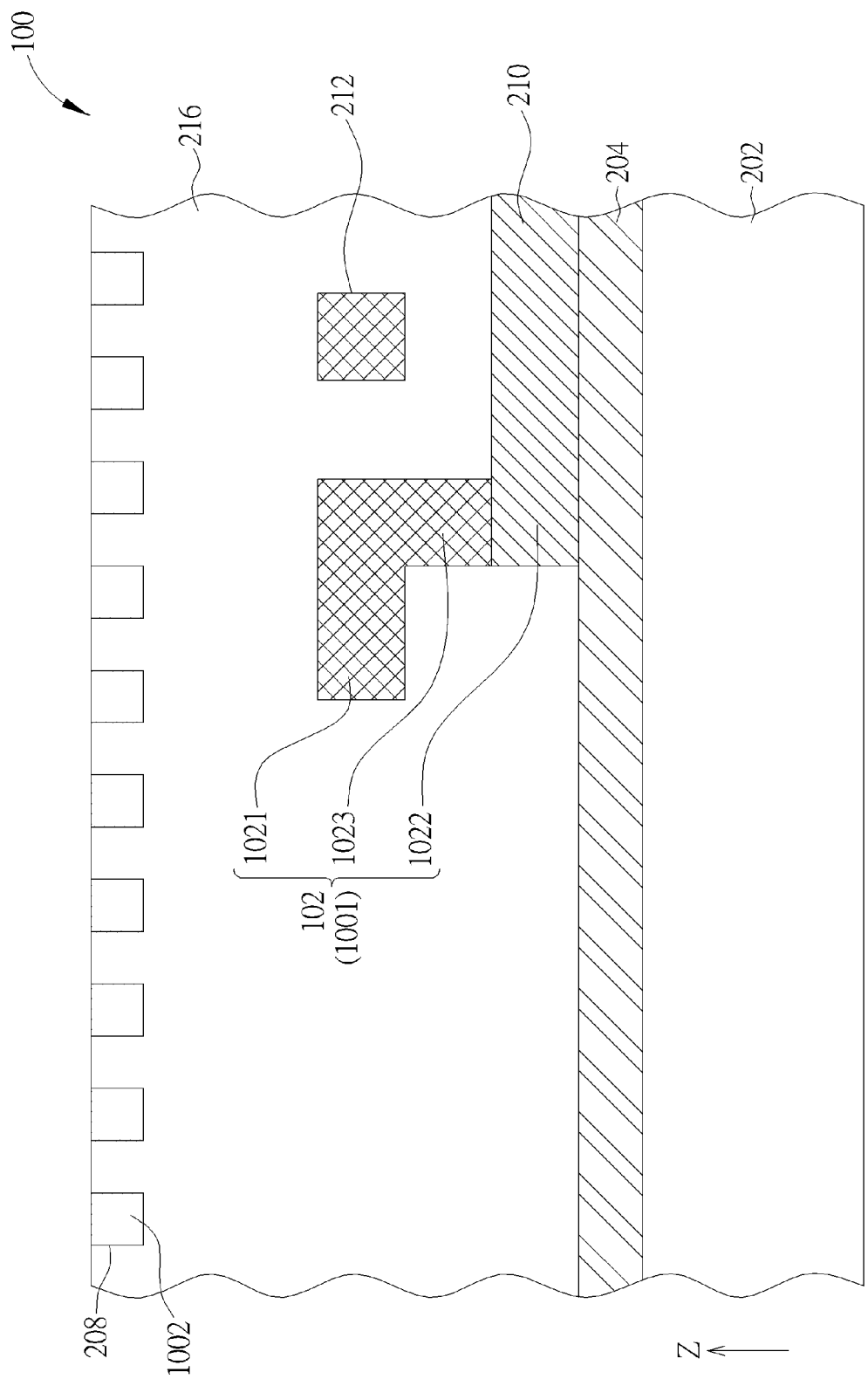
FIG. 5 is a partial sectional view of the semiconductor integrated circuit according to a third variant embodiment of the first embodiment of the present invention.

Referring to FIG. 5, FIG. 5 is a partial sectional view of the semiconductor integrated circuit according to a third variant embodiment of the first embodiment of the present invention. This variant embodiment is different from the second variant embodiment in that the high permeability patterns 1002 are not only disposed in the dielectric region 106 shown in FIG. 1, but also disposed in the region where the conductive loop 102 is disposed. In other words, some high permeability patterns 1002 overlap the first conductive layer 210 and the second conductive layer 212 in the projection direction with respect to the substrate 20, wherein the projection direction is perpendicular to the surface of the substrate 202, as shown by the direction Z.

Figure 6:
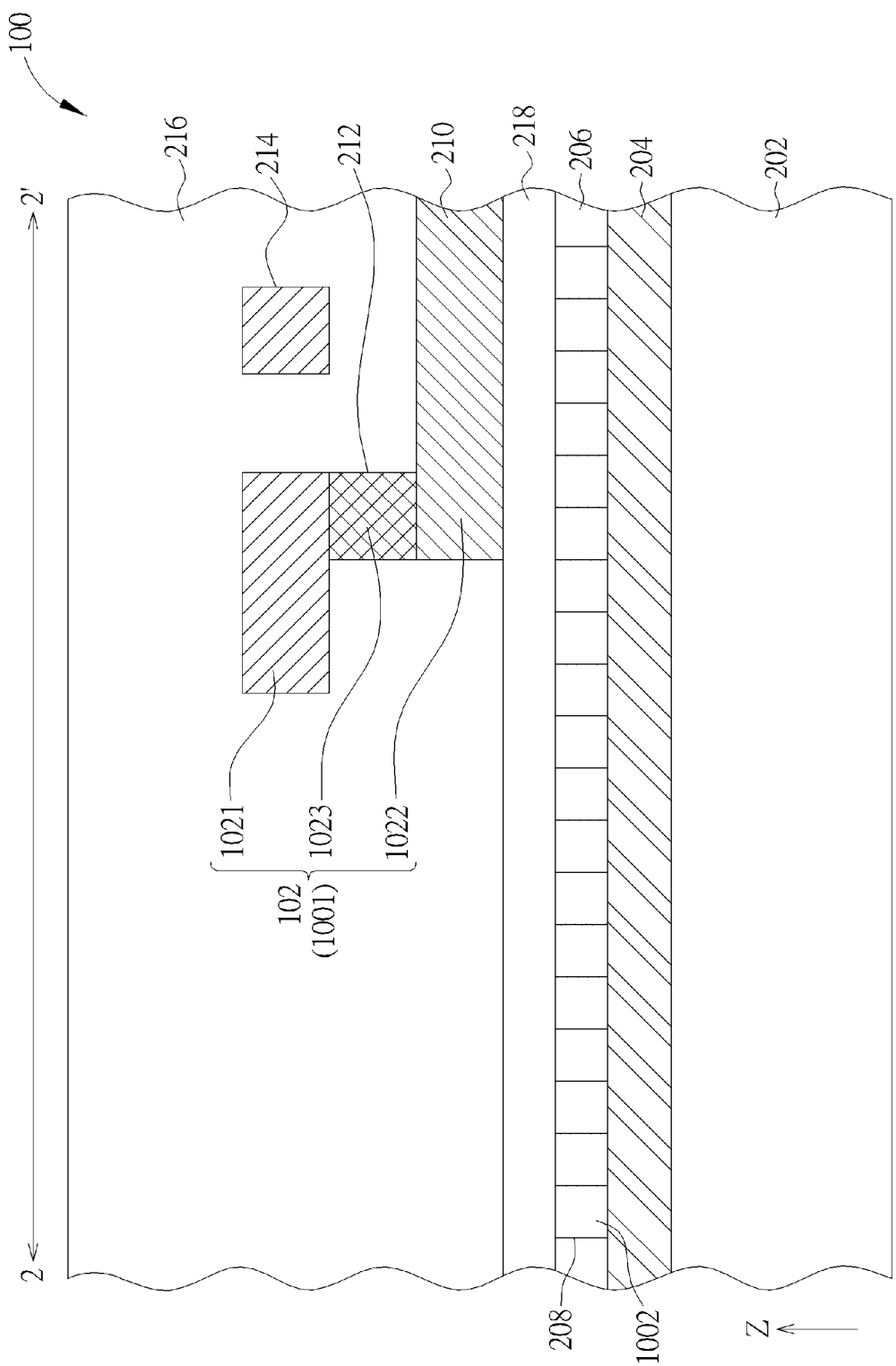
FIG. 6 is a partial sectional view of the semiconductor integrated circuit according to a fourth variant embodiment of the first embodiment of the present invention.

Referring to FIG. 6, FIG. 6 is a partial sectional view of the semiconductor integrated circuit according to a fourth variant embodiment of the first embodiment of the present invention. This variant embodiment is different from the first embodiment in that the high permeability patterns 1002 are not only disposed in the dielectric region 106 shown in FIG. 1, but also disposed in the region where the conductive loop 102 is disposed. Therefore, some high permeability patterns 1002 overlap the first conductive layer 210 and the second conductive layer 212 in the projection direction with respect to the substrate 20, wherein the projection direction is perpendicular to the surface of the substrate 202, as shown by the direction Z. Different from the third variant embodiment, the high permeability patterns 1002 overlapping the conductive loop 102 are disposed in the dielectric layer 206 underneath the first conductive layer 210.

Figure 7:
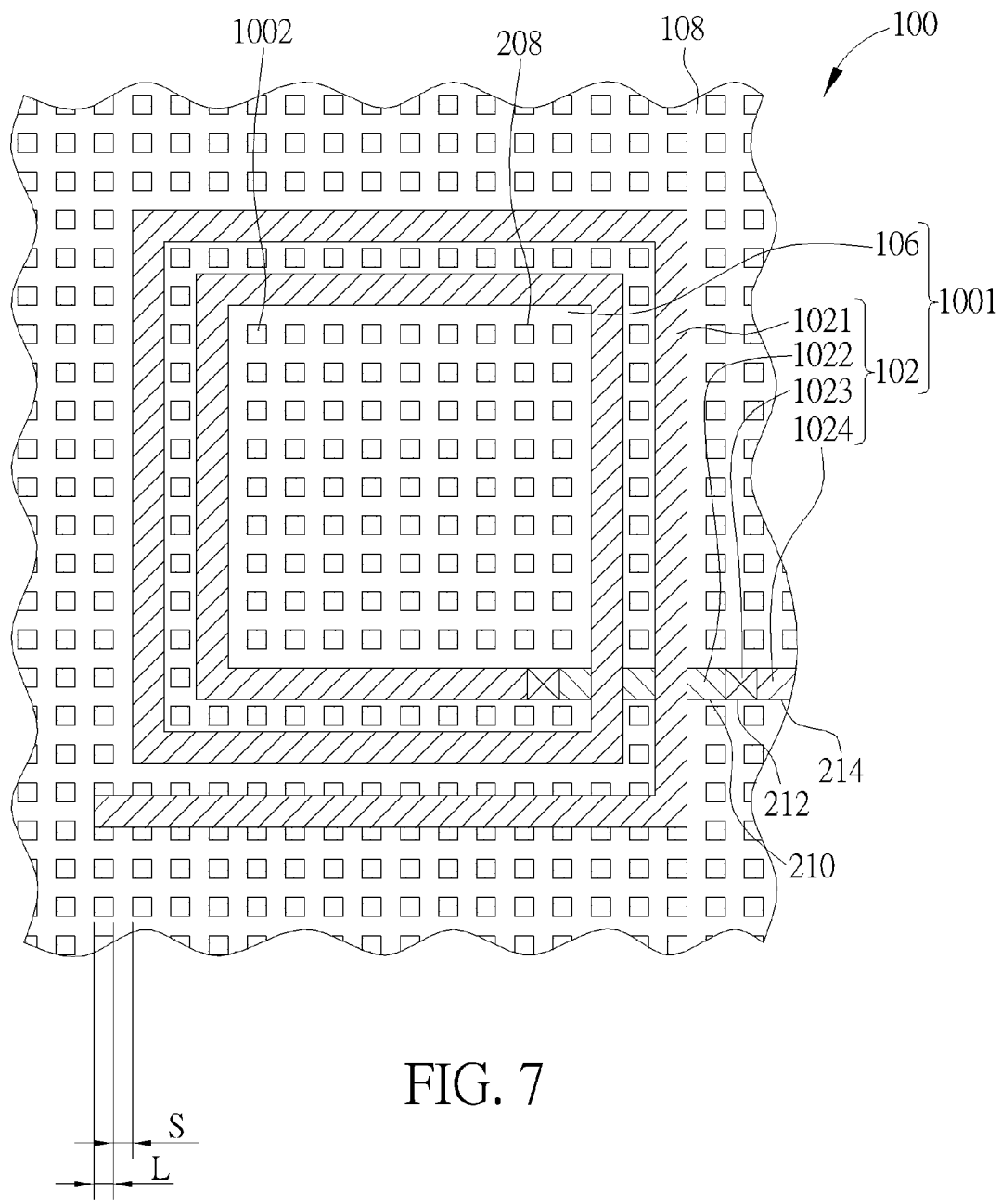
FIG. 7 is a top view of the semiconductor integrated circuit according to a second embodiment of the present invention.

Referring to FIG. 7, FIG. 7 is a top view of the semiconductor integrated circuit according to a second embodiment of the present invention. In this embodiment, the disposition area of the high permeability patterns 1002 extends from the dielectric region 106 to a surrounding region 108 that surrounds the conductive loop 102. Therefore, some high permeability patterns 1002 overlap the conductive loop 102, which are disposed underneath the conductive loop 102, but not limited thereto. The high permeability patterns 1002 overlapping the conductive loop 102 maybe positioned above the conductive loop 102 in other variant embodiments. In addition, the size L and the spacing S of all the high permeability patterns 1002 in this embodiment are equal, but not limited thereto. In some variant embodiments, the size L and the spacing S of the high permeability patterns 1002 may not be all the same in every part of the semiconductor integrated circuit 100. For example, the high permeability patterns 1002 may have different sizes L and/or spacings S in the dielectric region 106 and in the surrounding region 108 respectively.

Figure 8:
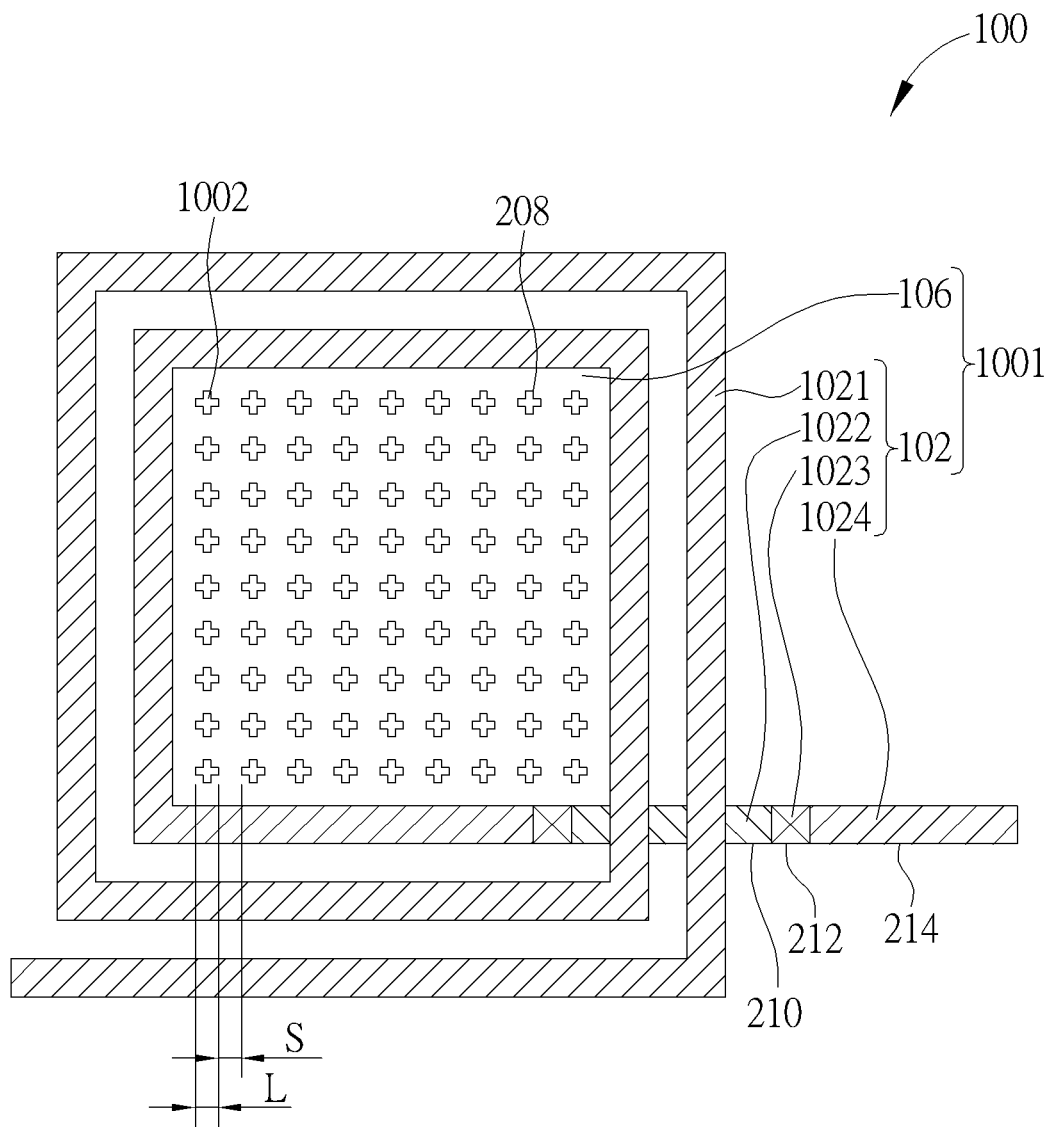
FIG. 8 is a top view of the semiconductor integrated circuit according to a third embodiment of the present invention.

Referring to FIG. 8, FIG. 8 is a top view of the semiconductor integrated circuit according to a third embodiment of the present invention. This embodiment is different from the first embodiment in that the high permeability patterns 1002 have cross shapes, which also provides the similar function to increase the quality factor of the inductor 1001. In other variant embodiments, the high permeability patterns 1002 may have various shapes, such as circle, ellipse, and rectangle, but not limited thereto. In addition, the high permeability patterns 1002 may not have all the same shapes in some variant embodiments, wherein they could have different shapes and sizes in different part of the semiconductor integrated circuit 100.

According to the present invention, the high permeability patterns are positioned adjacent to the conductive loop, wherein the high permeability patterns may be located above, underneath and/or around the conductive loop of the inductor, so as to effectively averages the distribution of the magnetic field of the inductor of the semiconductor integrated circuit, while the magnetic field of the inner turns are greater than that of the outer turns of the conductive loop of a traditional inductor without high permeability patterns. Therefore, current crowding on inner loops of the traditional inductor is mitigated by disposing the high permeability patterns, so as to increasing the inductance value and decreasing the AC resistivity value such that the quality factor is effectively improved. In addition, the high permeability patterns with relative small size to the inductor can minimize eddy current loss and increase magnetic field without incurring power loss. As a result, the performance of the inductor in the semiconductor integrated circuit of the present invention is effectively improved without other undesirable side effect.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. A semiconductor integrated circuit, comprising:
an inductor including one conductive loop; and
a plurality of high permeability patterns disposed adjacent to the conductive loop, wherein the high permeability patterns are composed of nickel, fiber, cobalt, an alloy of the above-mentioned materials, or a combination of the above-mentioned materials and the alloy, wherein the high permeability patterns is further disposed in a region surrounding the conductive loop.
2. The semiconductor integrated circuit according to claim 1, wherein the inductor further includes a dielectric region adjacent to the conductive loop, and the high permeability patterns at least disposed within the dielectric region.
3. The semiconductor integrated circuit according to claim 2, wherein the dielectric region is enclosed by the conductive loop.
4. The semiconductor integrated circuit according to claim 1, wherein each of the high permeability patterns is electrically floating with respect to circuit ground.
5. The semiconductor integrated circuit according to claim 1, wherein the high permeability patterns are pattern ground shielded and electrically connected to circuit ground.

6. The semiconductor integrated circuit according to claim 1, wherein the high permeability patterns are arranged as an array.

7. The semiconductor integrated circuit according to claim 1, wherein a size of the high permeability patterns is equal to a spacing between two of the high permeability patterns adjacent to each other.

8. The semiconductor integrated circuit according to claim 1, wherein a diameter of the inductor is equal to or more than fifty times of a size of the high permeability patterns.

9. The semiconductor integrated circuit according to claim 1, wherein a diameter of the inductor is equal to or more than hundredfold of a size of the high permeability patterns.

10. The semiconductor integrated circuit according to claim 1, wherein a size of the high permeability patterns is about 3 micrometers to about 10 micrometers.

11. The semiconductor integrated circuit according to claim 1, wherein a thickness of the high permeability patterns is about 2 micrometers.

12. The semiconductor integrated circuit according to claim 1, wherein the high permeability patterns have geometric shapes.

13. The semiconductor integrated circuit according to claim 12, wherein the high permeability patterns have square shapes or cross shapes.

14. The semiconductor integrated circuit according to claim 1, wherein the inductor is an integrated passive device.

15. A semiconductor integrated circuit comprising:
an inductor including one conductive loop; and
a plurality of high permeability patterns disposed adjacent to the conductive loop, wherein the high permeability patterns are composed of nickel, fiber, cobalt, an alloy of the above-mentioned materials, or a combination of the above-mentioned materials and the alloy, and wherein the conductive loop is composed of at least one conductive layer disposed on a substrate, and the high permeability patterns are composed of a high permeability layer disposed on the substrate.

16. The semiconductor integrated circuit according to claim 15, wherein the high permeability layer is disposed in a vertical direction between the conductive layer and the substrate.

17. The semiconductor integrated circuit according to claim 15, wherein the conductive layer is disposed in a vertical direction between the high permeability layer and the substrate.

18. The semiconductor integrated circuit according to claim 15, wherein the conductive loop is composed of at least two conductive layers disposed on the substrate, and the high permeability layer is disposed between the two conductive layers in a projection direction perpendicular to a surface of the substrate.

* * * * *